United States Patent
Booth, Jr. et al.

(10) Patent No.: US 7,235,875 B2
(45) Date of Patent: Jun. 26, 2007

(54) MODULAR HEAT SINK DECOUPLING CAPACITOR ARRAY FORMING HEAT SINK FINS AND POWER DISTRIBUTION INTERPOSER MODULE

(75) Inventors: Roger Allen Booth, Jr., Rochester, MN (US); Matthew Stephen Doyle, Rochester, MN (US); Don Alan Gilliland, Rochester, MN (US); Brian Edward Gregg, Rochester, MN (US); Lynn Robert Landin, Rochester, MN (US); Thomas W. Liang, Rochester, MN (US); Ankur Kanu Patel, Byron, MN (US); Dennis James Wurth, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 11/008,798

(22) Filed: Dec. 9, 2004

(65) Prior Publication Data
US 2006/0125086 A1   Jun. 15, 2006

(51) Int. Cl.
*H01L 23/10* (2006.01)
*H01L 29/06* (2006.01)

(52) U.S. Cl. .................. 257/706; 257/625; 257/707; 257/E33.075; 438/122

(58) Field of Classification Search .............. 257/772, 257/706, 707, 276, 625, 675, E33.075, E31.131; 438/122
See application file for complete search history.

(56) References Cited

U.S. PATENT DOCUMENTS

| | | | | |
|---|---|---|---|---|
| 5,556,811 A * | 9/1996 | Agatstein et al. | ........... | 438/106 |
| 6,058,019 A * | 5/2000 | Graves et al. | .............. | 361/760 |
| 6,102,710 A * | 8/2000 | Beilin et al. | .................. | 439/67 |
| 6,548,338 B2 | 4/2003 | Bernstein et al. | | |
| 6,567,259 B2 * | 5/2003 | Stevenson et al. | .......... | 361/302 |
| 6,972,833 B2 * | 12/2005 | Hashiguchi | .................. | 355/85 |
| 2003/0194832 A1 * | 10/2003 | Lopata et al. | ............... | 438/108 |
| 2004/0223290 A1 * | 11/2004 | Sutardja | .................. | 361/306.3 |
| 2005/0288741 A1 * | 12/2005 | Hassler et al. | ................ | 607/61 |

* cited by examiner

*Primary Examiner*—Long K. Tran
(74) *Attorney, Agent, or Firm*—Joan Pennington

(57) ABSTRACT

A modular heat sink decoupling capacitor array includes a plurality of modules, each defining parallel distributed decoupling plates, and each module forming a heat sink fi. Each module includes multiple spaced apart contacts for providing low inductance connections with an associated device. A power distribution interposer module is attached to a heat sink surface of the modular decoupling capacitor. The interposer module is used for implementing power delivery without using valuable ball grid array (BGA) connections and printed circuit board (PCB) layers.

11 Claims, 6 Drawing Sheets

MODULAR HEAT SINK DECOUPLING CAPACITOR ARRAY FORMING HEAT SINK FINS AND POWER DISTRIBUTION INTERPOSER MODULE

FIELD OF THE INVENTION

The present invention relates generally to semiconductor circuit devices utilizing decoupling capacitors and heat sinks and more particularly to a modular heat sink decoupling capacitor array forming heat sink fins and a power distribution interposer module.

DESCRIPTION OF THE RELATED ART

As integrated circuits on semiconductor chips became denser, faster and more complex, their electrical performance requirements became higher and the need for greater heat sink capacity became greater. As a result these integrated circuits required both greater and more effective capacitive decoupling and improved heat sink capacity.

Several different methods have been provided for implementing capacitive decoupling in integrated circuits. One approach added discrete decoupling capacitors onto the package containing the integrated semiconductor chip. A disadvantage of this approach since the decoupling capacitors are generally remote from the active circuitry on the chip is that the decoupling capacitors provide, at best, only marginal decoupling and no known heat sink capability.

Another approach added the capacitor in available regions in the circuitry itself. However, as the circuitry on the chip became denser, the need of larger and better decoupling capacitors that could handle larger on chip voltages or voltage spikes became greater just as the free area into which such capacitors could be placed became reduced. Thus the capacitors became smaller and any heat sinking capacity that they might have provided became similarly reduced.

Another approach utilizes the substrate of the chip itself as a capacitive plate with the other plate being comprised of an insulatively coated metallic deposit formed on the back or inactive major surface of the chip. Utilizing this arrangement not only reduces the ability to affix heat sinks onto the chip but the insulation on the surface of the second plate increases the thermal heating effects of devices on the chip leading to the possibility of reduced electrical performance in the circuitry.

U.S. Pat. No. 6,548,338 to Bernstein et al., issued Apr. 15, 2003 and assigned to the present assignee discloses an integrated decoupling capacitor and heat sink combination that in a single structure provides both a heat sink and a decoupling capacitor in close proximity to the active circuit on the chip requiring either heat sinking or decoupling capacitance or both. This integrated decoupling capacitor and heat sink combination is provided by forming on a semiconductor chip, having a buried oxide layer therein, an integrated high-performance decoupling capacitor that uses a metallic deposit greater than 30 microns thick formed on the back surface of the chip and electrically connected to the active chip circuit to result in a significant and very effective decoupling capacitor and heat sink in close proximity to the active circuit on the chip requiring such decoupling capacitance and heat sinking capabilities. The decoupling capacitance can use the substrate of the chip itself as one of the capacitive plates and a formed metallic deposit as the second capacitive plate, which also serves as a heat sink for the active circuit formed in the chip. The structure provides both a significant and effective decoupling capacitance in close proximity to the active circuit on the chip requiring such decoupling capacitance as well as providing improved heat sinking for the decoupled active circuit.

High performance systems, such as high performance computer systems, require more power, with larger and faster busses. Chip carriers have larger pin counts along with a smaller pitch. Printed circuit board (PCB) vias connecting surface power pads and PCB power planes are becoming smaller. PCB signal vias also are becoming smaller. Larger signal busses and larger power consumption require the PCBs to have more signal and power planes. Thick PCBs with small vias can significantly reduce board production yield. Additionally, a large percentage of ball grid array (BGA) connections are used in order to deliver power to a chip.

A need exists for an effective mechanism to deliver DC power to a module that enables ball grid array (BGA) assignment and PCB layers to be used for improved signal integrity.

SUMMARY OF THE INVENTION

A principal aspect of the present invention is to provide a modular heat sink decoupling capacitor array forming heat sink fins. Other important aspects of the present invention are to provide such modular heat sink decoupling capacitor array forming heat sink fins substantially without negative effect and that overcome many of the disadvantages of prior art arrangements.

In brief, a modular heat sink decoupling capacitor array is provided. The heat sink decoupling capacitor array includes a plurality of modules, each defining parallel distributed decoupling plates, and each module forming a heat sink fin. Each module includes multiple spaced apart contacts for providing low inductance connections with an associated device.

In accordance with features of the invention, a power distribution interposer module is attached to a heat sink surface of the modular heat sink decoupling capacitor array. The interposer module is used for implementing power delivery without using valuable ball grid array (BGA) connections and printed circuit board (PCB) layers.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
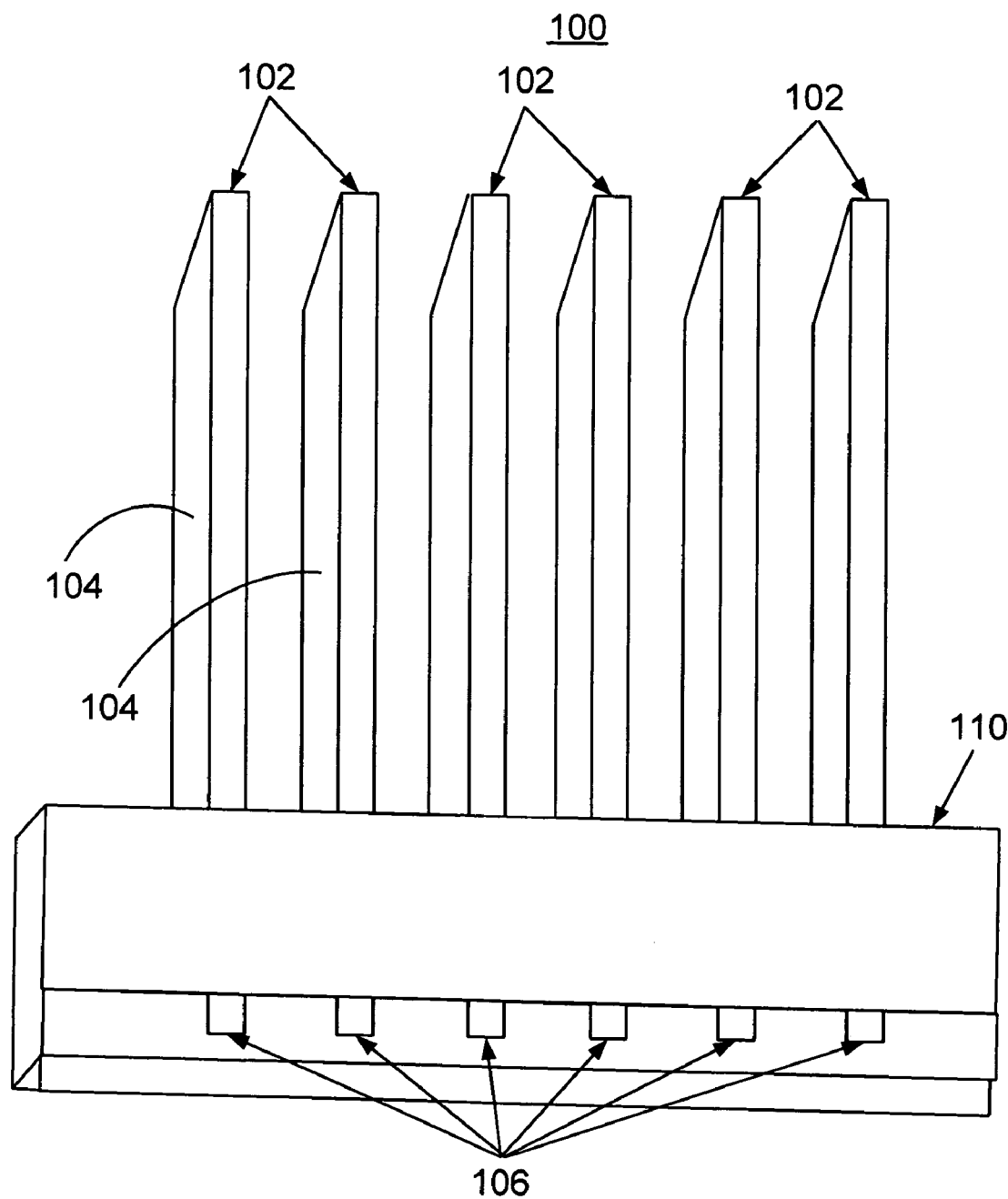
FIG. 1 is an isometric view not to scale of a modular heat sink decoupling capacitor array in accordance with one preferred embodimen.

Having reference now to the drawings, in FIG. 1, there is shown an integrated heat sink decoupling capacitor array generally designated by the reference character 100 in accordance with one preferred embodiment. Heat sink decoupling capacitor array 100 includes a plurality of modules 102. Each of the multiple modules 102 define one or more parallel distributed decoupling plates with an outside container 104 of each decoupling capacitor module 102 forming a heat sink fin. Each decoupling capacitor module 102 includes multiple spaced apart contacts 106 for providing low inductance connections. A base support member 110 receives and positions the contacts plurality of decoupling capacitor modules 102.

Each decoupling capacitor module 102 of the modular heat sink decoupling capacitor array 100 can be most economically implemented with a single dielectric material, such as external negative positive zero (NPO) single dielectric material, X7R, X5R, chip-on-glass (COG) single dielectric material, and the like, surrounding internal structures defining capacitor modules 102 of capacitor 100. The dielectric material is a poor conductor of electricity, while an efficient supporter of electrostatic fields that can store energy and particularly useful in the decoupling capacitor modules 102 and capacitor array 100. The use of a single dielectric material is the same practice used today by manufacturers of surface mount ceramic capacitors. This use of a single dielectric material within the decoupling capacitor modules 102 and integrated heat sinking modular decoupling capacitor 100 is both cost effective and acceptable for most circuit applications. Each of base support member 110 and heat sink fin 104 defined by decoupling capacitor module container is formed, for example, of aluminum.

Figure 2A:
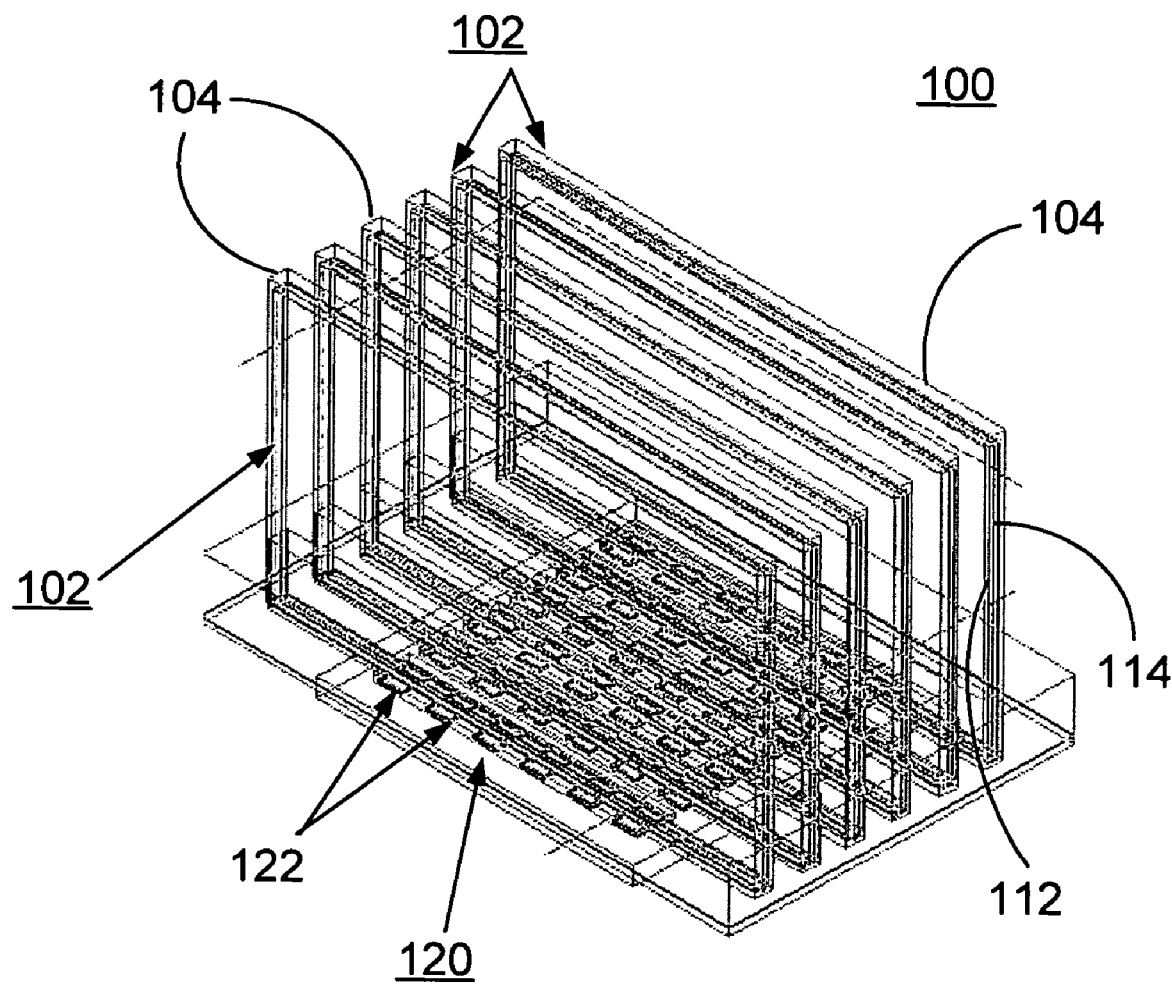
FIG. 2A is an isometric view not to scale illustrating a grid connection arrangement with the modular heat sink decoupling capacitor array of FIG. 1 shown in dotted line.
Figure 2B:
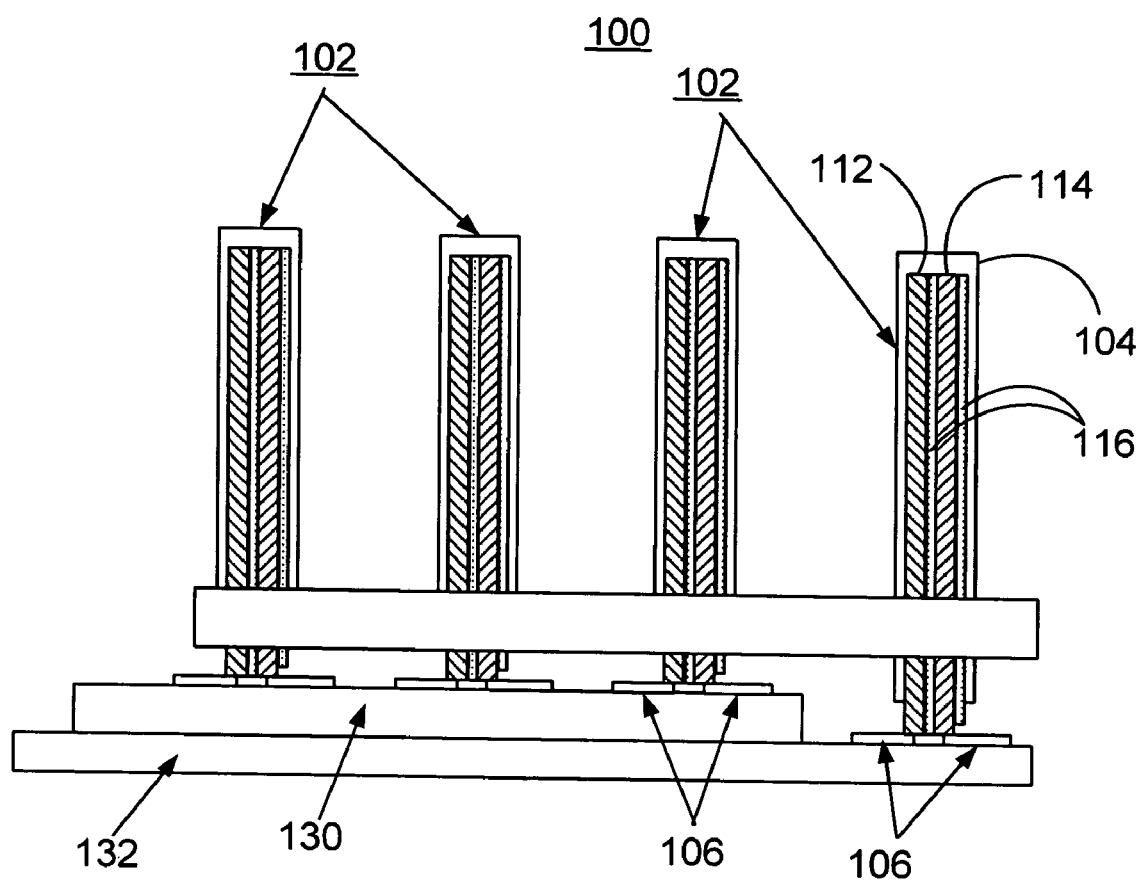
FIG. 2B is a sectional end view not to scale of an exemplary modular heat sink decoupling capacitor array of FIG. 1 illustrating connection with both a printed circuit board and an electrical module in accordance with a preferred embodiment.

Referring also to FIGS. 2A and 2B, various conventional materials can be used to form the capacitor plates of decoupling capacitor modules 102 of the heat sink decoupling capacitor array 100. For example, a ceramic material, such as fired ceramic powders with various metallic titanates, plus modifier and shifters, or a glass frit material can be used to form, for example, multiple parallel plates 112, 114 contained within the decoupling capacitor modules 102 such as shown in FIGS. 2A and 2B. A dielectric material preferably is contained between the decoupling capacitor parallel plates 112, 114. Electrodes formed of Palladium and silver or nickel can be used and capacitor terminations formed of silver and glass frit, copper and glass frit, nickel or tin can be used to form the capacitor contacts 106.

In FIG. 2A, there is shown an exemplary connection grid generally designated by the reference character 120 with the modular heat sink decoupling capacitor array 100 shown in dotted line. The connection grid 120 includes a plurality of connection pads 122 providing multiple capacitor contacts 106 for each of the decoupling capacitor modules 102. The pattern of connection grid 120, such as a ball grid array, has a size for electrical low inductance and high thermal conductivity. Heat transfer to the module or fins 104 through both conduction through the module dielectric material and conduction through the ground and voltage or power connections 104. Additional thermal benefit is obtained by placing the thermal support frame 110 around the modules fins 102 and down onto the module proximate the contact pads 104.

Referring now to FIG. 2B, an exemplary heat sink decoupling capacitor array 100 is shown illustrating connection with both an electrical module 130 and a printed circuit board 132 in accordance with a preferred embodiment. In addition to the contacts 106 contacting the top of the associated module 130, additional contacts are provided, for example, extending down one or more sides of the module 130 and contacting the associated printed circuit board 132. As shown in FIG. 2B, a pair of parallel plates 112, 114 is contained within the illustrated decoupling capacitor modules 102, for example with parallel plates 112 connected to ground and each of parallel plates 114 connected to a selected voltage potential. A plurality of layers of dielectric material 116 is contained between the decoupling capacitor parallel plates 112, 114.

Figure 2C:
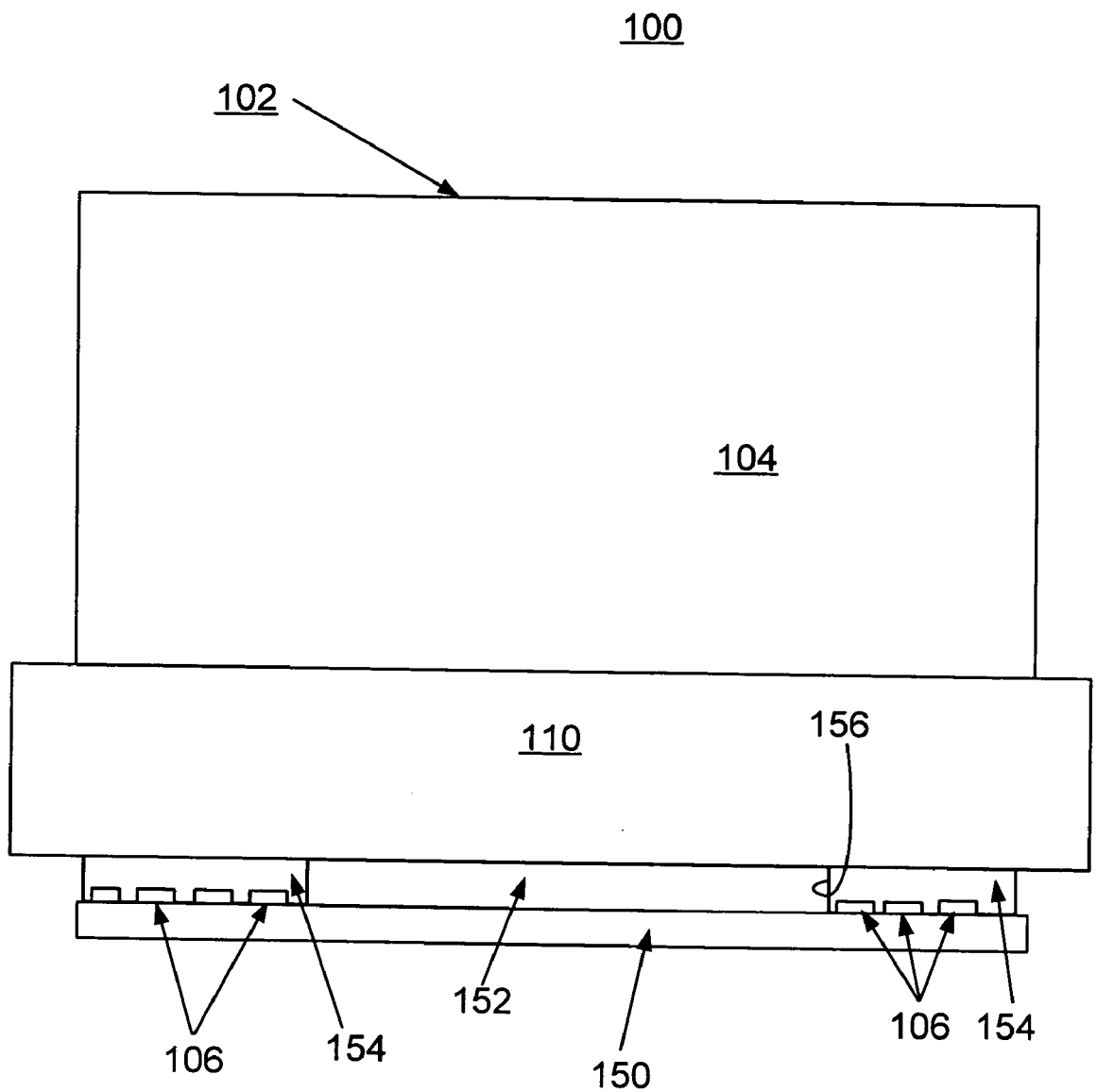
FIG. 2C is a side plan view not to scale of an exemplary modular heat sink decoupling capacitor array of FIG. 1 illustrating connection with a printed circuit board in accordance with a preferred embodiment.

Referring now to FIG. 2C, there is shown a side plan view not to scale of an exemplary modular heat sink decoupling capacitor array 100 illustrating connection with a printed circuit board 150. As shown in FIG. 2C, an illustrated electrical module 152 is not connected to the heat sink decoupling capacitor array 100. As shown in FIG. 2C, the heat sink decoupling capacitor array 100 includes opposed downwardly depending portions 154 along opposite ends of the heat sink decoupling capacitor array 100. The downwardly depending portions 154 define an inverted U-shaped cavity 156 for receiving the electrical module 152, for example, where the electrical module 152 does not include top contact pads. The downwardly depending portions 154 include contacts 106 for electrical connection with the associated printed circuit board 150.

Figure 3:
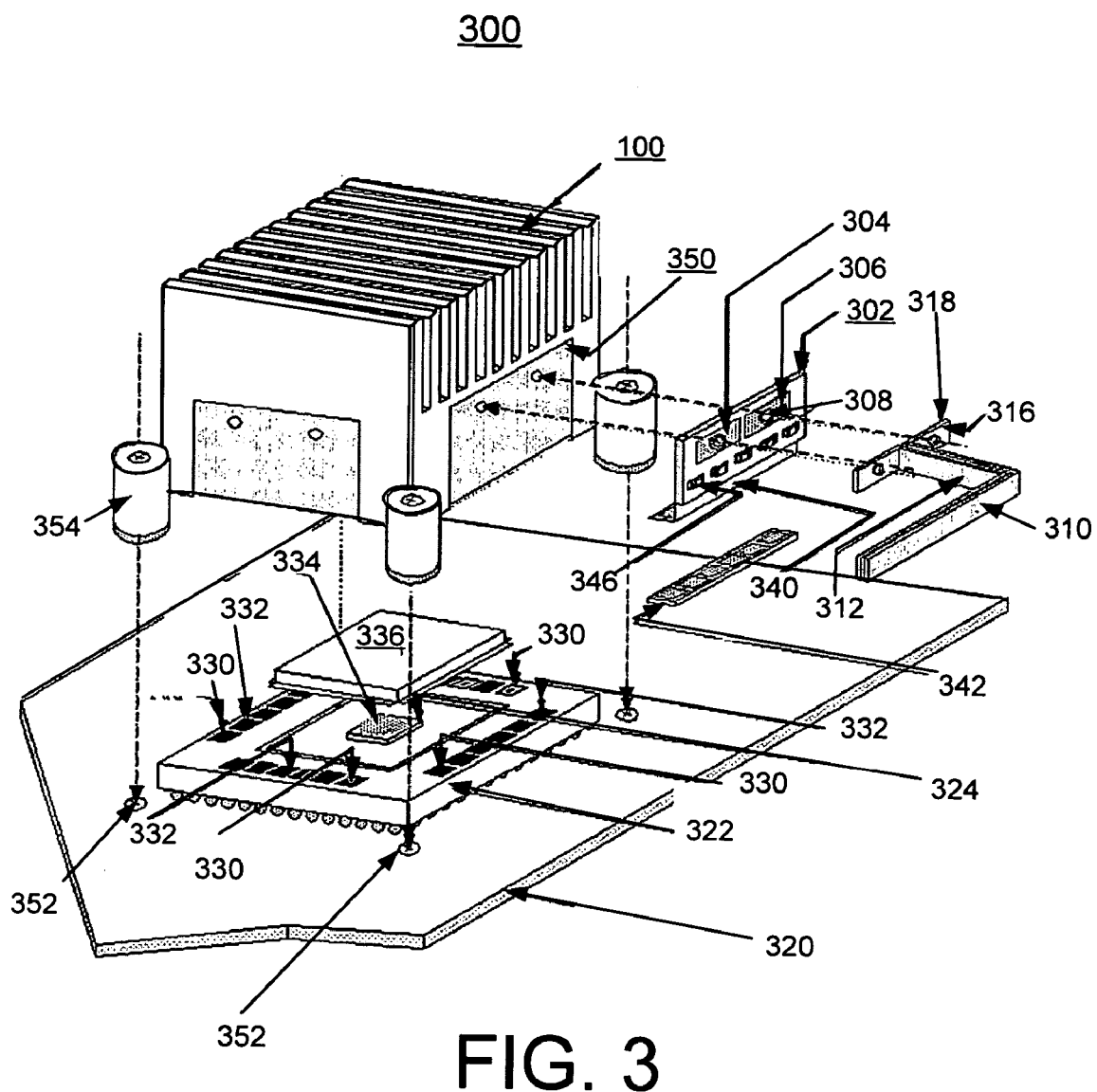
FIG. 3 is an exploded perspective view of a printed circuit board assembly including a power distribution interposer module and the modular heat sink decoupling capacitor array of FIG. 1 in accordance with one preferred embodiment.

It should be understood that various configurations can be provided for connecting with multiple capacitor contacts 106 of the decoupling capacitor modules 102, for example, with an associated module or printed circuit board, or with both an associated module and an associated printed circuit board. The contacts 106 can connect only with the associated printed circuit board where the top of an associated electrical module does not include contacts as shown in FIG. 2C. The associated electrical module can include contact pads on a top surface for ground and one or more voltages, for example, as shown in FIG. 3. Along with logic ground, each decoupling capacitor module 102 can have its own voltage. Internal to the associated module, the contact pads are part of a lead frame to contact ground and each voltage. The multiplicity of pads 106 and internal connections provide a low inductance path between the decoupling fin defined by each module 102 and the associated module.

Figure 4:
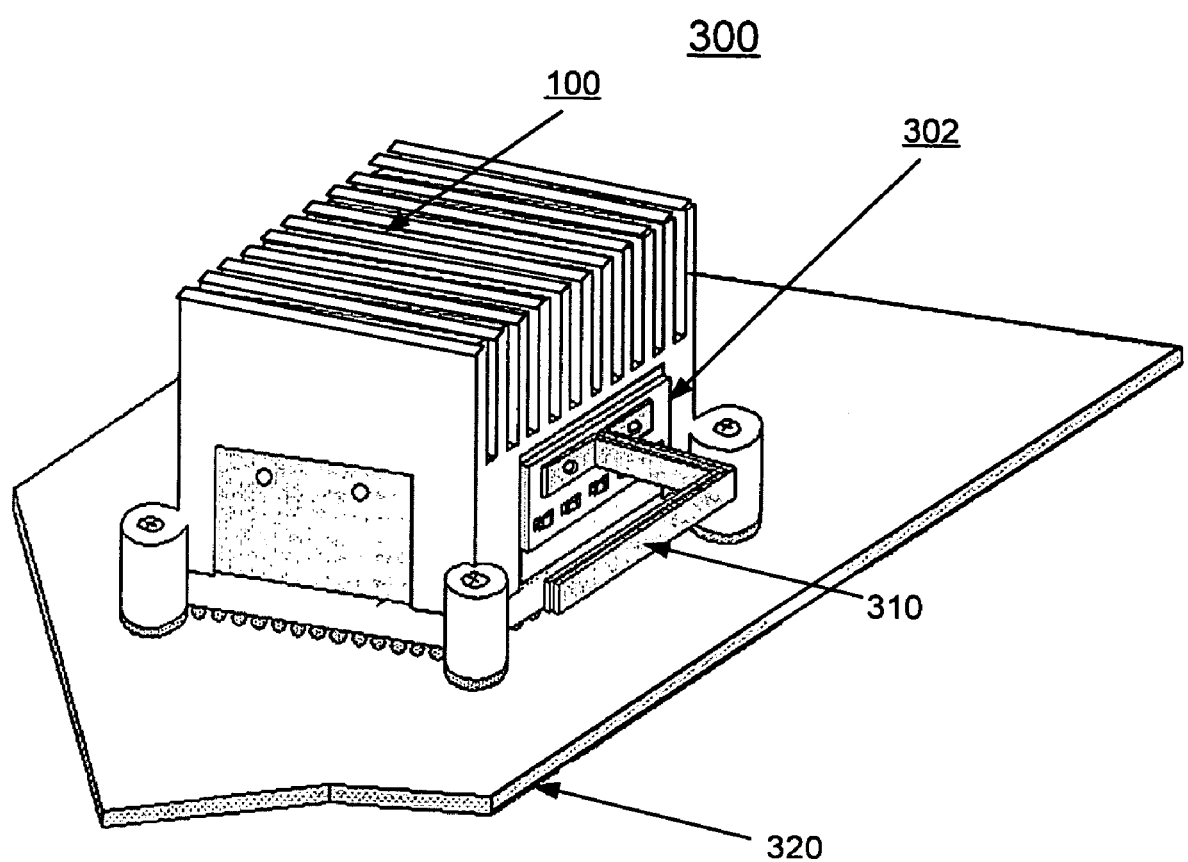
FIG. 4 is a perspective view of the printed circuit board assembly of FIG. 3 in a completed assembly with the power distribution interposer module attached to a heat sink surface of the modular heat sink decoupling capacitor array of FIG. 1 in accordance with one preferred embodiment.

Referring also to FIGS. 3 and 4, there is shown not to scale a printed circuit board assembly generally designated by the reference character 300 including a power distribution interposer module generally designated by the reference character 302 and the modular heat sink decoupling capacitor array 100 in accordance with one preferred embodiment. The power distribution interposer module 302 is a specialized interconnect that is attached to a heat sink surface of the modular heat sink decoupling capacitor array 100 for implementing power delivery without using valuable ball grid array (BGA) connections and printed circuit board (PCB) layers.

The power distribution interposer module 302 includes a power pad 304 and a ground pad 306, each including an insulator 308 positioned within a respective mounting opening. The power distribution interposer module 302 is used with a power cable 310 and a ground cable 312 connected via an insulator member 318 to a respective conductor 318. A printer circuit board 320 requiring no power planes supports a chip carrier 322. The power distribution interposer module 302 is used to route power from an external power supply (not shown) into the chip carrier 322. A chip 324 is mounted on the chip carrier 322. A plurality of power pads 330 and a plurality of ground pads 332 are carried by the chip carrier 322. A thermal grease 334 is provided on a top surface of the chip 224 with a cap 336 covering the chip 324.

As shown in FIG. 3, a flexible cable 340 is connected to the power distribution interposer module 302, for example, for connection via a pad-on-pad connector 342 mounted on one side of the top surface of chip carrier 322 for connecting with respective power pads 330 and ground pads 332. The power distribution interposer module 302 can include a discrete decoupling capacitor 346 to improve its functionality. The printed circuit board 320 includes a plurality of ground pads 352 for connection with grounding members 354 attached to the modular heat sink decoupling capacitor array 100.

As shown in FIG. 3, the power delivery is provided through the top surface of chip carrier 322 via respective power pads 330 and ground pads 332. This allows BGA connections that would otherwise be assigned to power delivery to be used for other purposes, such as additional 10 or placed for optimal signal integrity.

It should be understood that the power distribution interposer module 302 can be used to route power from the printed circuit board (PCB) 320 in instances where the PCB layers are readily available for use as power planes while still allowing conservation of BGA connections for other purposes.

While the present invention has been described with reference to the details of the embodiments of the invention shown in the drawing, these details are not intended to limit the scope of the invention as claimed in the appended claims.

What is claimed is:

1. A modular heat sink decoupling capacitor array comprising:
   a plurality of modules defining parallel distributed decoupling plates;
   a dielectric material surrounding each of said parallel distributed decoupling plates of said plurality of said modules;
   each said module forming a heat sink fin; and
   each said module including a plurality of spaced apart contacts for providing low inductance connections with an associated device;
   a power distribution interposer module for implementing power delivery without using valuable ball grid array (BGA) connections and printed circuit board (PCB) layers;
   said power distribution interposer module includes a flex cable; said flex cable connected to a pad-on-pad connector.

2. A modular heat sink decoupling capacitor array as recited in claim 1 wherein said dielectric material includes a selected one of the group of single dielectric materials including X7R, and X5R.

3. A modular heat sink decoupling capacitor array as recited in claim 1 wherein said plurality of spaced apart contacts of said plurality of modules are arranged in a connection grid pattern.

4. A modular heat sink decoupling capacitor array as recited in claim 1 wherein said plurality of spaced apart contacts are formed of a selected one of the group of electrically conductive materials including silver and glass frit, copper and glass frit, silver, copper, nickel, and tin.

5. A modular heat sink decoupling capacitor array as recited in claim 1 wherein said associated device includes a selected one of an electrical chip carrier module and a printed circuit board.

6. A modular heat sink decoupling capacitor array as recited in claim 1 wherein said power distribution interposer module is attached to a heat sink surface of one said module of the modular decoupling capacitor.

7. A modular heat sink decoupling capacitor array as recited in claim 1 wherein said pad-on-pad connector electrically connects said power distribution interposer module to a plurality of contact pads carried by a chip carrier.

8. A printed circuit board assembly comprising:
   a printed circuit board;
   a chip carrier mounted on said printed circuit board;
   a modular heat sink decoupling capacitor array mounted on said printed circuit board; said modular heat sink decoupling capacitor array including a plurality of modules, each defining parallel distributed decoupling plates; a dielectric material surrounding each of said parallel distributed decoupling plates of said plurality of said modules, each said module forming a heat sink fin; and each said module including a plurality of spaced apart contacts for providing electrical connections with a selected one of said chip carrier and said printed circuit board; and
   a power distribution interposer module mounted on said modular decoupling capacitor; said power distribution interposer module for implementing power delivery without using valuable ball grid array (BGA) connections and printed circuit board (PCB) layers; and said power distribution interposer module including a flex cable; said flex cable connected to a pad-on-pad connector.

9. A printed circuit board assembly as recited in claim 8 wherein said dielectric material includes a selected one of the group of single dielectric materials including X7R, and X5R.

10. A printed circuit board assembly as recited in claim 8 wherein said plurality of spaced apart contacts of said plurality of modules of said modular heat sink decoupling capacitor array are arranged in a connection grid pattern.

11. A printed circuit board assembly as recited in claim 8 wherein said plurality of spaced apart contacts are formed of a selected one of the group of electrically conductive materials including silver and glass frit, copper and glass frit, silver, copper, nickel, and tin.

* * * * *